(12) United States Patent
Lin et al.

(10) Patent No.: US 9,620,468 B2
(45) Date of Patent: Apr. 11, 2017

(54) SEMICONDUCTOR PACKAGING STRUCTURE AND METHOD FOR FORMING THE SAME

(71) Applicant: TONGFU MICROELECTRONICS CO., LTD., Nantong (CN)

(72) Inventors: Chang-Ming Lin, Nantong (CN); Yu-Juan Tao, Nantong (CN)

(73) Assignee: TONGFU MICROELECTRONICS CO., LTD., Nantong (CN)

( * ) Notice: Subject to any disclaimer, the term of this patent is extended or adjusted under 35 U.S.C. 154(b) by 0 days.

(21) Appl. No.: 14/074,637

(22) Filed: Nov. 7, 2013

(65) Prior Publication Data

US 2014/0124928 A1   May 8, 2014

(30) Foreign Application Priority Data

Nov. 8, 2012   (CN) .......................... 2012 1 0443751
Nov. 8, 2012   (CN) .......................... 2012 1 0444153

(51) Int. Cl.
*H01L 21/48* (2006.01)
*H01L 21/768* (2006.01)
(Continued)

(52) U.S. Cl.
CPC .......... *H01L 24/13* (2013.01); *H01L 23/3192* (2013.01); *H01L 24/02* (2013.01);
(Continued)

(58) Field of Classification Search
CPC ...... H01L 23/3192; H01L 24/02–24/17; H01L 2224/02313; H01L 2224/13609;
(Continued)

(56) References Cited

U.S. PATENT DOCUMENTS 6,077,765 A * 6/2000 Naya ........................ H01L 24/11
                                                      257/E21.508
6,387,734 B1 * 5/2002 Inaba et al. .................. 438/125
(Continued)

FOREIGN PATENT DOCUMENTS

CN        1359147 A    9/2000
CN        1298034 C    1/2007
(Continued)

*Primary Examiner* — Khiem D Nguyen
*Assistant Examiner* — Pauline Vu
(74) *Attorney, Agent, or Firm* — Anova Law Group, PLLC

(57) ABSTRACT

Various embodiments provide semiconductor packaging structures and methods for forming the same. In an exemplary method, a chip having a metal interconnect structure thereon can be provided. An insulating layer can be formed on the chip to expose the metal interconnect structure. A columnar electrode can be formed on the metal interconnect structure. A portion of the metal interconnect structure surrounding a bottom of the columnar electrode can be exposed. A diffusion barrier layer can be formed on sidewalls and a top surface of the columnar electrode, and on the exposed portion of the metal interconnect structure surrounding the bottom of the columnar electrode. A solder ball can then be formed on the diffusion barrier layer. The solder ball can wrap at least the sidewalls and the top surface of the columnar electrode.

19 Claims, 10 Drawing Sheets

(51) Int. Cl.
*H01L 23/522* (2006.01)
*H01L 23/00* (2006.01)
*H01L 23/31* (2006.01)
*H01L 23/525* (2006.01)

(52) U.S. Cl.
CPC ............ *H01L 24/11* (2013.01); *H01L 23/525* (2013.01); *H01L 24/03* (2013.01); *H01L 24/05* (2013.01); *H01L 2224/0239* (2013.01); *H01L 2224/02311* (2013.01); *H01L 2224/02313* (2013.01); *H01L 2224/02331* (2013.01); *H01L 2224/0345* (2013.01); *H01L 2224/03612* (2013.01); *H01L 2224/03614* (2013.01); *H01L 2224/03912* (2013.01); *H01L 2224/0401* (2013.01); *H01L 2224/05025* (2013.01); *H01L 2224/05124* (2013.01); *H01L 2224/05139* (2013.01); *H01L 2224/05144* (2013.01); *H01L 2224/05147* (2013.01); *H01L 2224/05624* (2013.01); *H01L 2224/05639* (2013.01); *H01L 2224/05644* (2013.01); *H01L 2224/05647* (2013.01); *H01L 2224/119* (2013.01); *H01L 2224/1132* (2013.01); *H01L 2224/1147* (2013.01); *H01L 2224/1191* (2013.01); *H01L 2224/11462* (2013.01); *H01L 2224/11825* (2013.01); *H01L 2224/11849* (2013.01); *H01L 2224/11903* (2013.01); *H01L 2224/131* (2013.01); *H01L 2224/136* (2013.01); *H01L 2224/13024* (2013.01); *H01L 2224/1357* (2013.01); *H01L 2224/13076* (2013.01); *H01L 2224/13082* (2013.01); *H01L 2224/13084* (2013.01); *H01L 2224/13111* (2013.01); *H01L 2224/13147* (2013.01); *H01L 2224/13541* (2013.01); *H01L 2224/13562* (2013.01); *H01L 2224/13582* (2013.01); *H01L 2224/13609* (2013.01); *H01L 2224/13611* (2013.01); *H01L 2224/13639* (2013.01); *H01L 2224/13644* (2013.01); *H01L 2224/13655* (2013.01); *H01L 2224/81191* (2013.01); *H01L 2924/12042* (2013.01)

(58) Field of Classification Search
CPC ..... H01L 2224/05147; H01L 2224/136; H01L 23/3157; H01L 2224/119; H01L 2224/11902; H01L 2224/11903
See application file for complete search history.

(56) References Cited

U.S. PATENT DOCUMENTS

| | | | | |
|---|---|---|---|---|
| 6,479,900 | B1* | 11/2002 | Shinogi et al. | 257/758 |
| 6,841,872 | B1* | 1/2005 | Ha et al. | 257/736 |
| 2002/0173134 | A1* | 11/2002 | Viswanadam | H01L 24/11 438/613 |
| 2002/0185733 | A1* | 12/2002 | Chow | H01L 21/2885 257/737 |
| 2003/0025202 | A1* | 2/2003 | Mikagi | H01L 24/11 257/737 |
| 2004/0134974 | A1* | 7/2004 | Oh | B23K 3/0623 228/245 |
| 2004/0207082 | A1* | 10/2004 | Yamano | H01L 23/3114 257/738 |
| 2005/0245059 | A1* | 11/2005 | Yuan | H01L 24/11 438/612 |
| 2005/0253264 | A1* | 11/2005 | Aiba et al. | 257/738 |
| 2006/0017171 | A1* | 1/2006 | Weng | H01L 24/13 257/766 |
| 2006/0030140 | A1* | 2/2006 | Koblis | H01L 21/4853 438/613 |
| 2006/0046349 | A1* | 3/2006 | Takeuchi | G03F 7/70983 438/106 |
| 2006/0094224 | A1* | 5/2006 | Huang | H01L 24/11 438/612 |
| 2006/0231942 | A1* | 10/2006 | Nagasaki | H01L 21/561 257/690 |
| 2006/0246706 | A1* | 11/2006 | Ke | H01L 24/11 438/613 |
| 2007/0085224 | A1* | 4/2007 | Kouno | H01L 23/3114 257/791 |
| 2008/0150134 | A1* | 6/2008 | Shinkai | H01L 24/13 257/737 |
| 2008/0296764 | A1* | 12/2008 | Chang et al. | 257/738 |
| 2009/0079094 | A1* | 3/2009 | Lin | 257/778 |
| 2009/0130840 | A1* | 5/2009 | Wang et al. | 438/614 |
| 2011/0101521 | A1* | 5/2011 | Hwang | H01L 21/76885 257/737 |
| 2011/0101523 | A1* | 5/2011 | Hwang et al. | 257/737 |
| 2011/0260317 | A1* | 10/2011 | Lu | H01L 24/11 257/737 |
| 2012/0091577 | A1* | 4/2012 | Hwang et al. | 257/737 |
| 2012/0252168 | A1* | 10/2012 | Nah | H01L 21/563 438/124 |

FOREIGN PATENT DOCUMENTS

| | | |
|---|---|---|
| CN | 101355845 A | 1/2009 |
| CN | 101764116 A | 6/2010 |
| CN | 102237316 A | 11/2011 |
| JP | 2011-18750 A * | 1/2011 .......... H01L 2224/11 |

* cited by examiner

SEMICONDUCTOR PACKAGING STRUCTURE AND METHOD FOR FORMING THE SAME

CROSS-REFERENCES TO RELATED APPLICATIONS

This application claims priority to Chinese Patent Application No. 201210444153.6, filed on Nov. 8, 2012, and Chinese Patent Application No. 201210443751.1, filed on Nov. 8, 2012, the entire contents of which are incorporated herein by reference.

FIELD OF THE DISCLOSURE

The present disclosure relates to the field of semiconductor packaging technology and, more particularly, relates to semiconductor packaging structures and methods for forming the same.

BACKGROUND

In current semiconductor industry, electronic packaging has become an important aspect in the development of the industry. After decades of packaging technology development, conventional peripheral-wiring-type packaging method and ball grid array packaging technology can no longer meet current high-density and small-size packaging requirements. Wafer-level chip scale packaging technology (WLCSP) has become a popular packaging method.

FIG. 1 depicts a cross-sectional view of a packaging structure of an existing WLCSP method. The structure includes a silicon substrate 1, an insulating layer 2 on a surface of the silicon substrate 1. The insulating layer 2 has an opening. The surface of the silicon substrate 1 exposed by the opening has a pad 3. A rewiring metal layer 4 is disposed on the pad 3 and a surface of the insulating layer 2. The rewiring metal layer 4 is used for redistributing positions of ball grid array packaging solder joints. A copper pillar 5 is formed on a surface of the rewiring metal layer 4. The copper pillar 5 is connected to the pad 3 via the rewiring metal layer 4. A sealing material layer 6 made of organic resin is disposed to cover the rewiring metal layer 4 and the insulating layer 2. A solder ball 7 is formed on the top surface of the copper pillar 5.

However, the solder ball 7 as described in the above packaging structure can easily fall off from the top surface of the copper pillar 5 and, as a result, cause chip failure.

BRIEF SUMMARY OF THE DISCLOSURE

One aspect of the present disclosure includes a method for forming a semiconductor packaging structure. In an exemplary method, a chip having a metal interconnect structure thereon can be provided. An insulating layer can be formed on the chip to expose the metal interconnect structure. A columnar electrode can be formed on the metal interconnect structure. A portion of the metal interconnect structure surrounding a bottom of the columnar electrode can be exposed. A diffusion barrier layer can be formed on sidewalls and a top surface of the columnar electrode, and on the exposed portion of the metal interconnect structure surrounding the bottom of the columnar electrode. A solder ball can then be formed on the diffusion barrier layer. The solder ball can wrap at least the sidewalls and the top surface of the columnar electrode.

Another aspect of the present disclosure includes a semiconductor packaging structure. An exemplary structure can include a chip having a metal interconnect structure thereon, and an insulating layer on the chip to expose the metal interconnect structure. The structure can further include a columnar electrode on the metal interconnect structure. A portion of the metal interconnect structure surrounding a bottom of the columnar electrode can be exposed. Further, the structure can include a diffusion barrier layer on sidewalls and a top surface of the columnar electrode, and on the exposed portion of the metal interconnect structure surrounding the bottom of the columnar electrode. Yet further, the structure can include a solder ball on the diffusion barrier layer. The solder ball can wrap at least the sidewalls and the top surface of the columnar electrode.

Other aspects or embodiments of the present disclosure can be understood by those skilled in the art in light of the description, the claims, and the drawings of the present disclosure.

DETAILED DESCRIPTION

Figure 1:
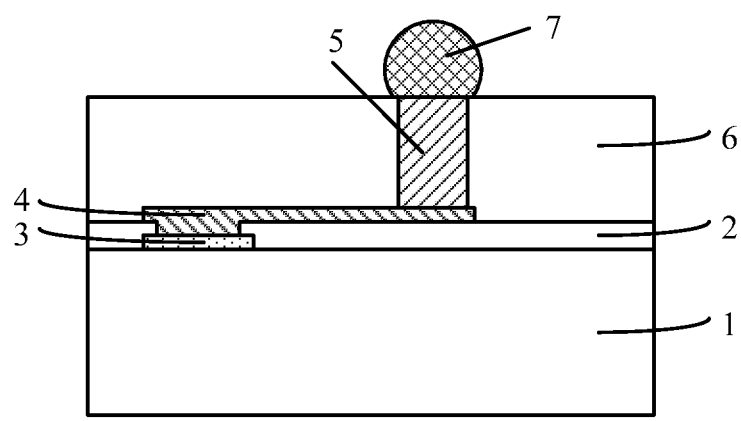
FIG. 1 depicts a cross-sectional view of a conventional semiconductor packaging structure.

Reference will now be made in detail to exemplary embodiments of the disclosure, which are illustrated in the accompanying drawings. Wherever possible, the same reference numbers will be used throughout the drawings to refer to the same or like parts.

In conventional packaging structures including a solder ball and a copper pillar, the solder ball tends to fall off from a top surface of the copper pillar, thus causing chip failure. Such a problem may be caused by two main reasons.

First, because the solder ball is formed directly on the surface of the copper pillar, a contact surface between the solder ball and the copper pillar, and the contact surface between the solder ball and the sealing material layer are in a same plane. Therefore, mechanical strength between the solder ball and the copper pillar, and between the solder ball and the sealing material layer, is low.

Second, the solder ball is made of a material that mainly includes tin and may also including lead, silver, etc. After the solder ball is formed on the top surface of the copper pillar, during at a high-temperature reflow process, the tin at the contact surface can react with copper to form a tin-copper intermetallic compound (IMC), or a tin-copper alloy IMC. With increasing of a thickness of the tin-copper IMC, tin atoms in the solder (e.g., tin solder) at the contact surface are gradually reduced, and proportion of lead atoms and silver atoms relatively increases. Thus, softness of the solder ball increases, and fixing strength is reduced such that the entire solder ball tend to fall off from the top surface of the copper pillar.

In addition, when the tin reacts with the copper to form the tin-copper IMC, at an initial stage, the tin reacts with the copper to form η-phase (or Eta phase) $Cu_6Sn_5$. The $Cu_6Sn_5$ has a weight percent of copper of about 40%. However, with time, copper atoms in the copper pillar continuously diffuse into the tin-copper IMC to form ε-phase (or Epsilon phase) $Cu_3Sn$. The $Cu_3Sn$ has a weight percent of copper that can increase to about 66%. A surface energy of the ε-phase (or Epsilon phase) $Cu_3Sn$ is significantly lower than the η-phase (or Eta phase) $Cu_6Sn_5$. Thus, a surface of the tin-copper IMC is prone to dewetting or nonwetting, which may cause the entire solder ball to easily fall off from the top surface of the copper pillar.

Various embodiments provide semiconductor packaging structures and methods for forming the same. In an exemplary method, a chip is provided. The chip can have a metal interconnect structure thereon. An insulating layer can be formed on the chip and exposing the metal interconnect structure. A columnar electrode can be formed on the metal interconnect structure. A portion of the metal interconnect structure surrounding a bottom of the columnar electrode can be exposed. A diffusion barrier layer can be formed on sidewalls and a top surface of the columnar electrode, and on the exposed portion of the metal interconnect structure surrounding the bottom of the columnar electrode. A solder ball can be formed on the diffusion barrier layer. The solder ball can wrap at least the sidewalls and the top surface of the columnar electrode.

Because the diffusion barrier layer can be located on the sidewalls and the top surface of the columnar electrode, the columnar electrode can be isolated from the solder ball. Thus, tin-copper alloy IMC is not formed, so the columnar electrode may not easily fall off from the columnar electrode.

In addition, the diffusion barrier layer can be formed not only on the sidewalls and the top surface of the columnar electrode, but also on the exposed portion of the metal interconnect structure surrounding the bottom of the columnar electrode. Thus, the diffusion barrier layer can increase binding force between the columnar electrode (e.g., the copper pillar) and the metal interconnect structure. As a result, the columnar electrode may not easily detach from the metal interconnect structure.

Further, because the solder ball can be formed at least on the sidewalls and on the top surface of the columnar electrode, when an external force flicks the solder ball, the solder ball cannot easily peel off from the columnar electrode.

Figure 2:
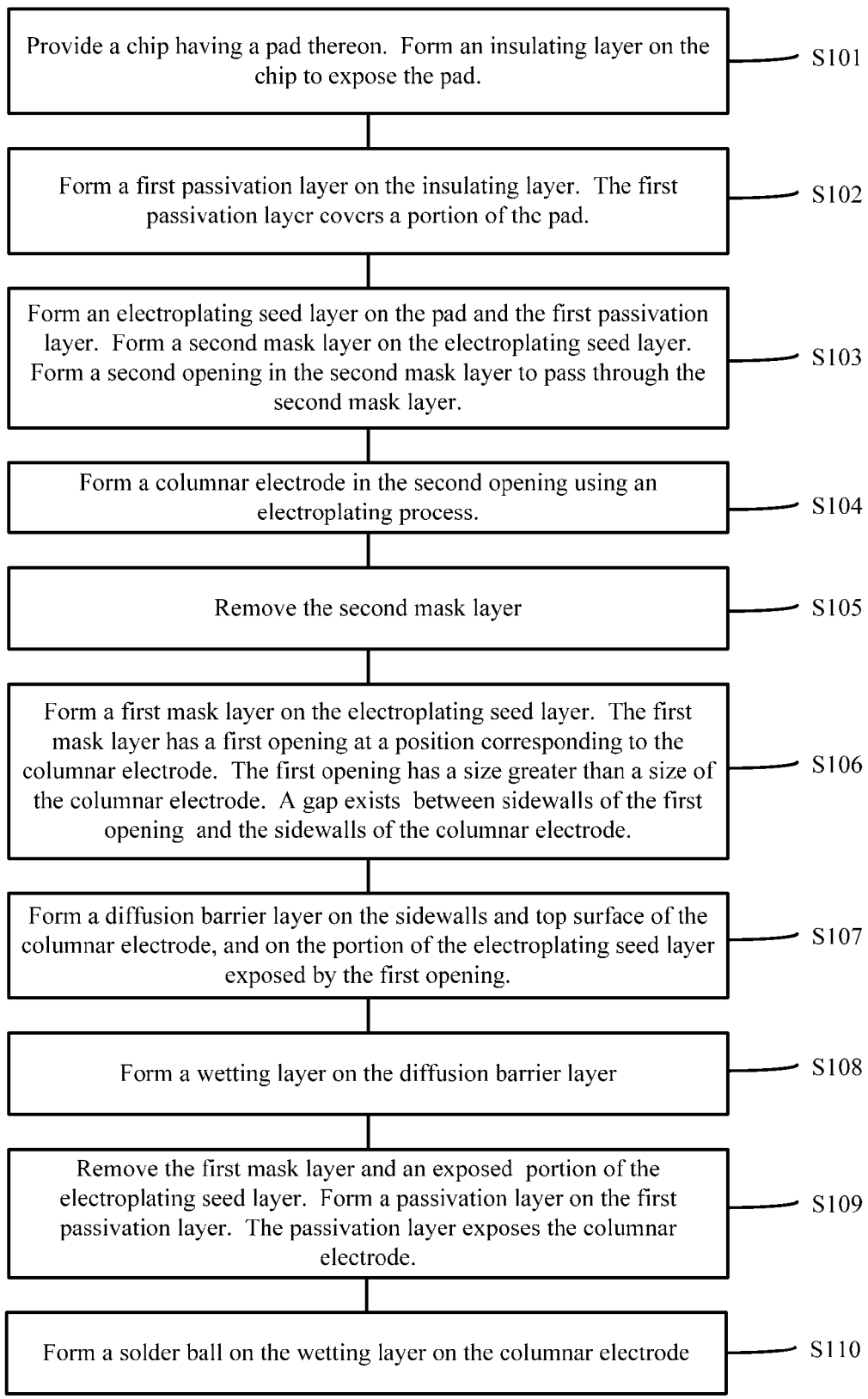
FIG. 2 depicts a flow diagram of an exemplary method for forming a semiconductor packaging structure in accordance with various disclosed embodiments.

FIG. 2 depicts a flow diagram of an exemplary method for forming a semiconductor packaging structure in accordance with various disclosed embodiments. FIGS. 3-12 depict cross-sectional views of the semiconductor packaging structure at various stages during its formation in accordance with various disclosed embodiments. Note that although FIGS. 3-12 depict structures corresponding to the method depicted in FIG. 2, the structures and the method are not limited to one another in any manner.

Figure 3:
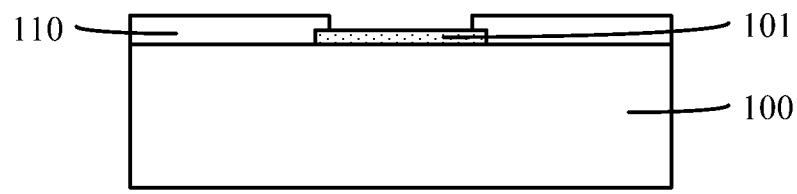
FIGS. 3-12 depict cross-sectional views of an exemplary semiconductor packaging structure at various stages during its formation in accordance with various disclosed embodiments.

In Step S101 of FIG. 2 and referring to FIG. 3, a chip 100 is provided. A pad 101 can be formed on a surface of the chip 100. An insulating layer 110 can be disposed on the surface of the chip 100 to expose the pad 101.

The chip 100 can be a silicon substrate, a germanium substrate, and/or a silicon-on-insulator substrate. There can be a semiconductor device (not shown) and/or metal interconnect structures (not shown) formed in the chip 100. The semiconductor device and the pad 101 may be located on (or adjacent to) a same surface or different surfaces of the chip 100. The semiconductor device can be electrically connected to the pad 101. When the semiconductor device and the pad 101 are located on different surfaces (i.e. on surfaces at different sides) of the chip 100, the semiconductor device and the pad 101 can be electrically connected using through-silicon vias that pass through the chip 100.

In one embodiment, the pad 101 can form a metal interconnect structure with a subsequently-formed electroplating seed layer on a surface of the pad 101. A columnar electrode can be subsequently formed on the pad 101. The pad 101 can be made of a material including aluminum, copper, gold, and/or silver. The semiconductor device can be connected to an external circuit using the pad 101, the subsequently-formed columnar electrode, a subsequently-formed solder ball, etc.

After the pad 101 is formed, an insulating material layer can be disposed on the surface of the chip 100 and the pad 101. The insulating material layer can be etched to expose the pad 101 and form the insulating layer 110. The insulating layer 110 can be a single-layer or a multi-layer stacking structure including one or more of silicon oxide layer, silicon nitride layer, polyimide resin layer, and/or benzoxazine resin layer. In one embodiment, the insulating layer 110 can be a silicon oxide layer.

Figure 4:
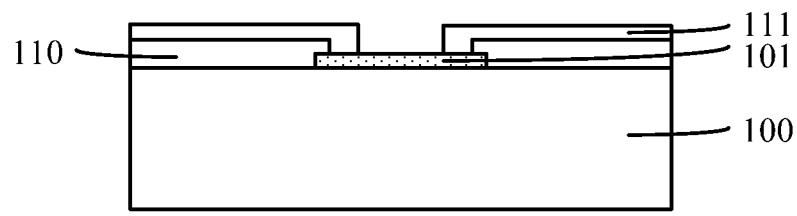

In Step S102 of FIG. 2 and referring to FIG. 4, optionally, a first passivation layer 111 is formed on a surface of the insulating layer 110. The first passivation layer 111 can cover a portion of the pad 101.

Pads on chips manufactured by chip manufacturers usually tend to be large, so columnar electrodes formed on the pads tend to have a large size accordingly. Thus, the first passivation layer 111 can be formed on the insulating layer 110 such that the first passivation layer 111 can cover a portion of the pad 101, so an exposed portion of the pad 101 can be smaller (e.g., smaller than the entire pad 101), thus resulting in easier formation of high-density packaging structures. In one embodiment, the first passivation layer 111 may not need to be formed. An electroplating seed layer can be formed directly on the insulating layer 110 and the pad 101. The first passivation layer 111 and the insulating layer 110 can be made of a same material or different materials.

Figure 5:
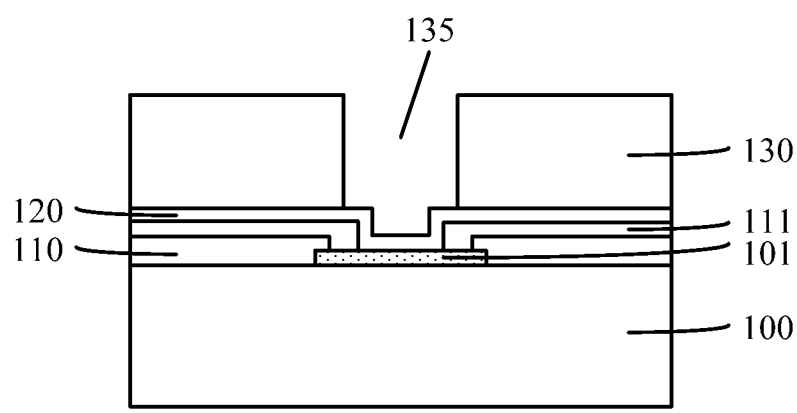

In Step S103 of FIG. 2 and referring to FIG. 5, an electroplating seed layer 120 is formed on a surface of the pad 101 and the first passivation layer 111. A second mask layer 130 can be formed on a surface of the electroplating seed layer 120. A second opening 135 can be formed in the second mask layer 130 to pass through the second mask layer 130. The second opening 135 can expose a portion of the electroplating seed layer 120.

The electroplating seed layer 120 can be made of a material including a mixture of one or more of aluminum, copper, gold, silver. A process of forming the electroplating seed layer 120 can include a sputtering process or a physical vapor deposition process. In various embodiments, an under-bump metallization (UBM) layer can be formed on the pad 101 and the first passivation layer 111. The UBM layer can be used as the electroplating seed layer.

For example, when the electroplating seed layer 120 is made of a material including aluminum, the process of forming the electroplating seed layer 120 can include a sputtering process. When the electroplating seed layer 120 is made of a material including copper, gold, or silver, the process of forming the electroplating seed layer 120 can include a physical vapor deposition process. In one embodiment, the electroplating seed layer 120 can be made of a material including copper.

The second mask layer 130 can be made of a material including one or more of photoresist, silicon oxide, silicon nitride, amorphous carbon. In one embodiment, the second mask material layer 130 can be made of a photoresist. The second opening 135 passing through the second mask layer 130 can be formed in the second mask layer 130 using a photolithography process. The second opening 135 can subsequently be used to form a columnar electrode. A top-view size of the second opening 135 can be greater than, equal to, or smaller than the size of the pad 101.

Figure 6:
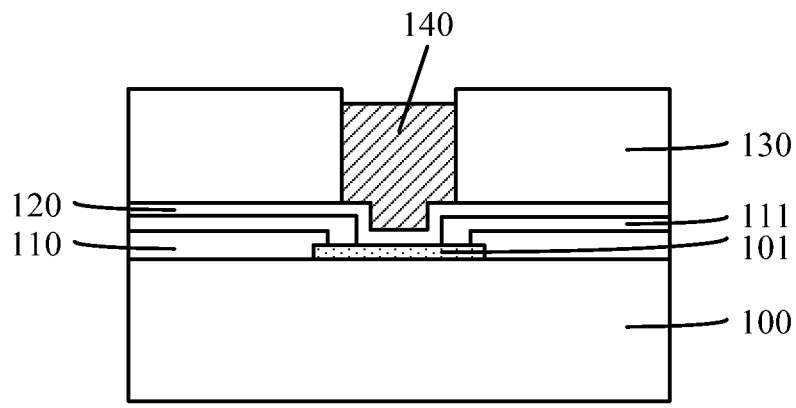

In Step S104 of FIG. 2 and referring to FIG. 6, a columnar electrode 140 is formed in the second opening 135 (e.g., as shown in FIG. 5) using an electroplating process. For example, the columnar electrode 140 can be made of a material including copper. The electroplating seed layer 120 can be electrically connected to a cathode of a DC power supply of electroplating. A copper anode of the DC power supply can be immersed in an aqueous solution of copper sulfate. A DC current can pass through, such that a copper pillar can be formed on the surface of the portion of the electroplating seed layer 120 exposed by the second opening 135, to form the columnar electrode 140. A height of the columnar electrode 140 can be less than or equal to a depth of the second opening 135.

When a solder ball is formed directly on a flat top surface of a copper pillar (e.g., as in conventional technology), because of internal tension of the solder ball, the solder ball has a final spherical shape after the reflow process. Thus, the solder ball has a relatively large size.

According to various disclosed embodiments, a subsequent-formed solder ball can be formed on a top surface and sidewalls of the columnar electrode 140. And during the reflow process, solder (e.g., tin solder) in a molten state can have tension at an interface with a diffusion barrier layer on a surface of the columnar electrode 140. As a result, the solder can uniformly cover a surface of the diffusion barrier layer. Thus, a total width (of the copper pillar, the diffusion barrier layer on the sidewalls of the copper pillar, and the solder) can be less than a width of the solder ball. So a solder density can be increased. In addition, a consumed amount of solder using the disclosed methods can be less than a consumed amount of solder using conventional methods.

Figure 7:
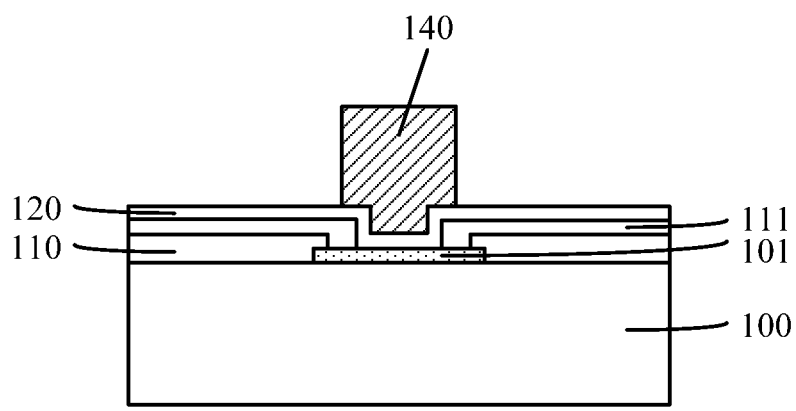

In Step S105 of FIG. 2 and referring to FIG. 7, the second mask layer 130 (e.g., as shown in FIG. 6) is removed. For example, a process of removing the second mask layer 130 can include an ashing process. After the second mask layer 130 is removed, the electroplating seed layer 120 can be exposed. In one embodiment, because a subsequent process of forming a diffusion barrier layer and a wetting layer can include an electroplating process, the electroplating seed layer 120 can be retained in this step.

In another embodiment, when a subsequent process of forming the diffusion barrier layer and the wetting layer includes an electroless plating process, the electroplating seed layer can be removed. For example, a process of removing the electroplating seed layer can include the following steps. A fourth mask layer (not shown) can be formed on the surface of the electroplating seed layer. The fourth mask layer can cover the columnar electrode. Using the fourth mask layer as an etch mask, an exposed portion of the electroplating seed layer can be removed using a wet etching process or a dry etching process. A portion of the electroplating seed layer surrounding the columnar electrode can be retained. The fourth mask layer can then be removed.

In yet another embodiment, after the second mask layer 130 is removed, the portion of the electroplating seed layer not covered by the columnar electrode can be removed using a dry etching process. Because the electroplating seed layer can usually be very thin and the columnar electrode can usually be very thick, by controlling an etching time and an etching power, the columnar electrode is not significantly affected at the same time of removing the electroplating seed layer.

Figure 8:
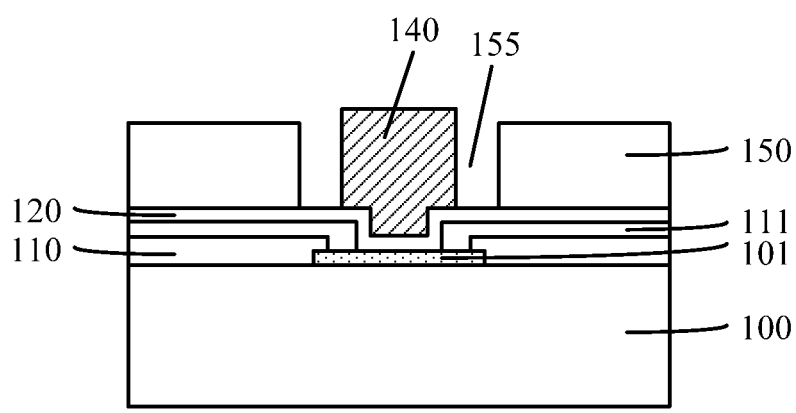

In Step S106 of FIG. 2 and referring to FIG. 8, a first mask layer 150 is formed on the surface of the electroplating seed layer 120. The first mask layer 150 can have a first opening 155 at a position corresponding to the columnar electrode 140. The first opening 155 can have a size (e.g., a top-view size) greater than a size (e.g., a top-view size) of the columnar electrode 140. In addition, there can be a gap between sidewalls of the first opening 155 and the sidewalls of the columnar electrode 140.

The first mask layer 150 can be made of a material including one or more of photoresist, silicon oxide, silicon nitride, amorphous carbon. In one embodiment, the first mask material layer 150 can be made of a photoresist. The first opening 155 can be formed in the photoresist using a photolithography process. Because there is a gap between the sidewalls of the first opening 155 and the sidewalls of the columnar electrode 140, a diffusion barrier layer can subsequently be formed on the sidewalls and the top of the columnar electrode 140.

In some embodiments, the first opening 155 can expose the portion of the electroplating seed layer 120 surrounding the bottom portion (i.e., the lower portion) of the columnar electrode 140, a subsequently-formed diffusion barrier layer can have a cross-sectional shape of a "⌠" shape (i.e., an 'Ω' shape). In other embodiments, the first opening 155 does not expose the portion of the electroplating seed layer 120 surrounding the bottom portion of the columnar electrode 140 (e.g., the portion of the electroplating seed layer 120 surrounding the bottom portion of the columnar electrode 140 may have been removed in previous steps, e.g., in Step S105), so that the columnar electrode 140 can cover (or fully cover) remaining portion of the electroplating seed layer 120. As a result, the diffusion barrier layer can subsequently be formed on the sidewalls and the top of the columnar electrode 140.

Figure 9:
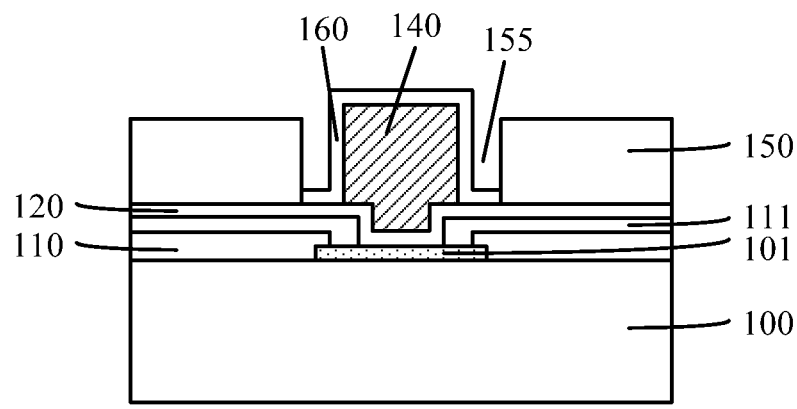

In Step S107 of FIG. 2 and referring to FIG. 9, a diffusion barrier layer 160 is formed on the sidewalls of the columnar electrode 140, a top surface of the columnar electrode 140, and a surface of the portion of the electroplating seed layer 120 exposed by the first opening 155. The diffusion barrier layer 160 can be used to prevent copper in the columnar electrode 140 from reacting with tin in the solder ball to form an $\epsilon$-phase tin-copper IMC.

In one embodiment, the diffusion barrier layer 160 can include a nickel layer. The nickel layer can prevent the copper of the columnar electrode 140 from diffusing into the solder ball to react with the tin in the solder ball to form the $\epsilon$-phase tin-copper IMC. In addition, the nickel layer can prevent the surface(s) of the columnar electrode 140 from oxidation that may affect on-resistance.

Because the diffusion barrier layer 160 can be disposed between the columnar electrode 140 and the solder ball, the columnar electrode 140 can be isolated from the solder ball. Thus, when the solder ball is subsequently formed on a surface of the diffusion barrier layer 160 or a wetting layer, the tin-copper IMC is not formed at an interface there between. Therefore, the solder ball does not easily fall off from the top surface of the columnar electrode.

In some embodiments, a process of forming the diffusion barrier layer 160 can include an electroless plating process. In other embodiments, the process of forming the diffusion barrier layer 160 can include an electroplating process. For example, an electroplating solution for electroplating the nickel layer can contain nickel sulfamate having a concentration ranging from about 700 grams per liter to about 800 grams per liter, nickel chloride having a concentration ranging from about 6 grams per liter to about 8 grams per liter, and boric acid having a concentration ranging from about 35 grams per liter to about 45 grams per liter. The electroplating solution can have a PH value ranging from about 4 to about 6 and a bath temperature ranging from about 45 to about 55 degrees Celsius.

Generally, the electroplating process and the electroless plating process can form a plating layer on a surface of a metal. In one embodiment, the diffusion barrier layer 160 (e.g., the nickel layer) can be formed on the sidewalls and the top surface of the columnar electrode 140 and on the electroplating seed layer 120 exposed by the first opening 155, the diffusion barrier layer 160 can have a cross-sectional shape of a " ЛЬ " shape (i.e., an 'Ω' shape). A lowest portion of the diffusion barrier layer 160 can be parallel to the pad 101 and can be connected to the electroplating seed layer 120. As a result, a subsequently-formed wetting layer can accordingly have a cross-sectional shape of a " ЛЬ " shape.

Therefore, the subsequently-formed solder ball can be located not only on the sidewalls and the top surface of the columnar electrode 140, but also on a surface of the wetting layer disposed on the electroplating seed layer 120. The solder ball can thus be in contact with three surfaces, so binding force between the solder ball and the columnar electrode 140 can be increased. The solder ball can be prohibited from shaking up-and-down or side-to-side. So the solder ball may not fall off easily, and reliability of the packaging structure can be improved.

In addition, because the diffusion barrier layer 160 can have a cross-sectional shape of a " ЛЬ " shape, the lowest portion of the diffusion barrier layer 160 can be parallel to the pad 101 and can be connected to the electroplating seed layer 120. An upper portion of the diffusion barrier layer 160 can cover the sidewalls and the top surface of the columnar electrode 140. Thus, the binding force between the columnar electrode 140 and the electroplating seed layer 120 can be improved by using the diffusion barrier layer 160. As a result, the columnar electrode 140 may not easily peel off from the electroplating seed layer 120.

Figure 10:
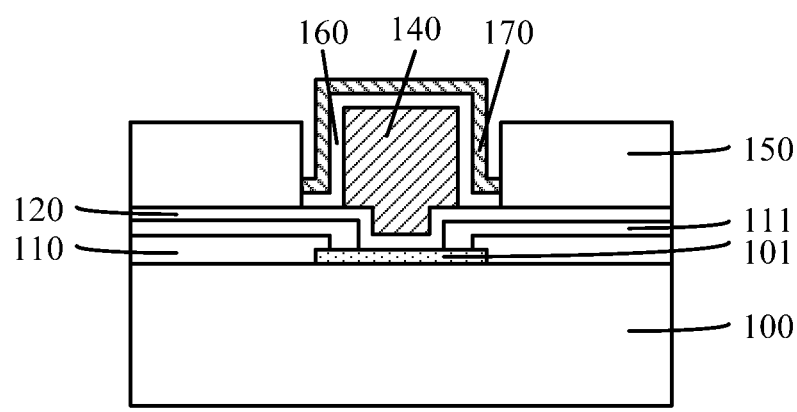

In Step S108 of FIG. 2 and referring to FIG. 10, a wetting layer 170 is formed on a surface of the diffusion barrier layer 160. In one embodiment, the wetting layer 170 can be made of a material including at least one of gold (or elemental gold), silver (or elemental silver), indium (or elemental indium), and tin (or elemental tin). For example, the wetting layer 170 can included a gold layer, a silver layer, a tin layer, a tin-silver alloy layer, a tin-indium alloy layer, etc. A process of forming the wetting layer 170 can include an electroless plating process or an electroplating process.

Generally, nickel may tend to react with oxygen in air. The wetting layer 170 containing gold element, silver element, indium element, or tin element can be less likely to react with oxygen in the air. Therefore, forming the wetting layer 170 on the diffusion barrier layer 160 can prevent an oxidation layer from forming on the surface of the diffusion barrier layer 160.

In addition, solder (e.g., tin solder) may have desired wettability on a surface of the wetting layer 170 containing gold element, silver element, indium element, or tin element. Thus, the solder ball formed after a subsequent reflow process can have a strong binding force with the columnar electrode 140, so that the solder ball may not easily peel off.

Generally, gold and silver can have low resistance. In subsequent processes, the wetting layer 170 can have inter-diffusion with the solder ball and the diffusion barrier layer 160 to a certain extent, to form alloy layer(s). The alloy layer(s) containing gold or silver can effectively reduce interconnect resistance of the packaging structure.

In one embodiment, the wetting layer 170 can include a tin layer formed by electroplating. For example, an electroplating solution for electroplating the tin layer can contain sodium stannate having a concentration ranging from about 40 grams per liter to about 60 grams per liter, sodium hydroxide having a concentration ranging from about 10 grams per liter to about 16 grams per liter, and sodium acetate having a concentration ranging from about 20 grams per liter to about 30 grams per liter. The electroplating solution can have a bath temperature ranging from about 70 to about 85 degrees Celsius.

Because a main component of a solder ball can include tin, the solder ball and the wetting layer 170 (e.g., the tin layer) can have a substantially same or similar composition. In addition, the solder (e.g., the tin solder) of the solder ball and the wetting layer 170 can have low melting points. Therefore, in the subsequent reflow process, the solder (e.g., the tin solder) and the wetting layer 170 can inter-diffuse after melting to form a whole. Further, the wetting layer can have a cross-sectional shape of a " ЛЬ " shape, so the solder ball can thus have a cross-sectional shape (e.g., a final cross-sectional shape) of a " ЛЬ " shape accordingly. The solder ball can wrap the top surface and the sidewalls of the columnar electrode 140 and the surface of the wetting layer 170 on the electroplating seed layer 120. Thus, the solder ball may not shake easily, so reliability of the solder ball can be improved.

In another embodiment, the wetting layer is not formed. The solder ball can be formed on the surface of the diffusion barrier layer 160.

Figure 11:
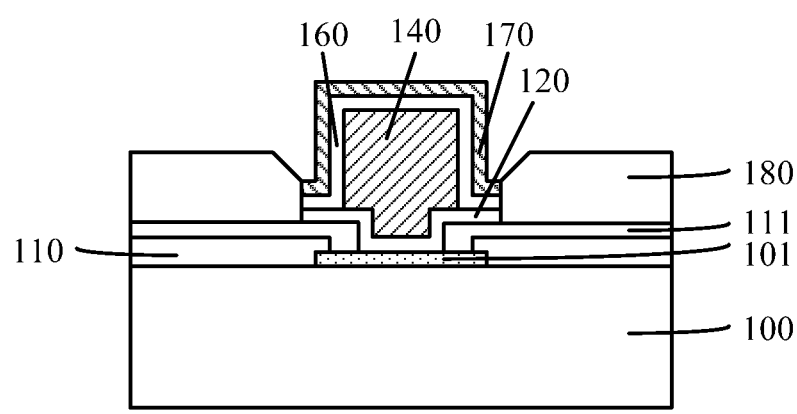

In Step S109 of FIG. 2 and referring to FIG. 11, the first mask layer 150 (referring to FIG. 10) and an exposed (i.e., accordingly-exposed) portion of the electroplating seed layer 120 (referring to FIG. 10) is removed accordingly. A passivation layer 180 can be formed on the surface of the first passivation layer 111. The passivation layer 180 can expose the columnar electrode 140. In one embodiment, a process of removing the first mask layer 150 can include an ashing process.

In some embodiments, a process of removing the exposed portion of the electroplating seed layer 120 can include the following steps. A fifth mask layer (not shown) can be formed on the electroplating seed layer 120, such that the fifth mask layer can cover the columnar electrode 140. Using the fifth mask layer as an etch mask, the exposed portion of the electroplating seed layer 120 can be removed using a wet etching process or a dry etching process. The fifth mask layer can then be removed.

In other embodiments, a process of removing the exposed portion of the electroplating seed layer 120 can include the following steps. After the first mask layer 130 is removed, the portion of the electroplating seed layer not covered by the columnar electrode 140 can be removed using a dry etching process. Because the electroplating seed layer 120 can usually be very thin, and the diffusion barrier layer 160 and the wetting layer 170 on the columnar electrode 140 can be relatively thick, by controlling an etching time and an etching power, the diffusion barrier layer 160 and the wetting layer 170 are not significantly affected during the removal of the exposed portion of the electroplating seed layer 120.

The passivation layer 180 can be made of one or more of a silicon oxide layer, silicon nitride, a silicon oxynitride layer, polyimide, epoxy, phenolic resin, benzoxazine resin. The passivation layer 180 can be used for electrical insulation and water vapor (e.g., moist) insulation of the chip from external environment. In one embodiment, the passivation layer 180 can be made of a material including epoxy resin, and can be coated on the surface of the first passivation layer 111, e.g., using a screen printing process or any other suitable processes. The passivation layer 180 can expose the columnar electrode 140, so a solder ball can be subsequently formed on the columnar electrode 140.

In one embodiment, the solder ball may be formed first, and then the passivation layer 180 can be formed. In another embodiment, the passivation layer is not formed, and the electrical insulation and water vapor insulation of the chip from the external environment may be achieved using the insulating layer 110 or the first passivation layer 111.

Figure 12:
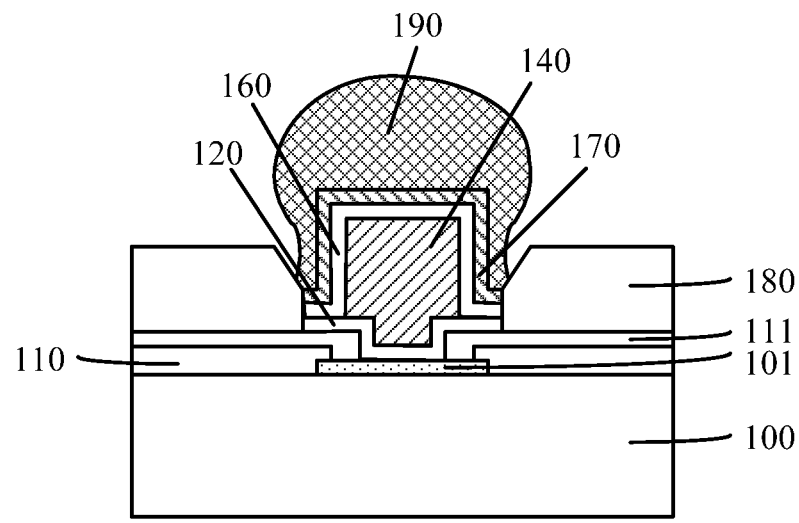

In Step S110 of FIG. 2 and referring to FIG. 12, a solder ball 190 is formed on a surface of the wetting layer 170 on the columnar electrode 140.

A process of forming the solder ball 190 can include two steps including a solder (or tin solder) paste forming process and a reflow soldering process (or reflow process). First, solder paste is formed on the columnar electrode 140 using the solder paste forming process. Next, the solder paste reflows during the reflow process, such that the formed solder ball 190 can wrap in the top surface and the sidewalls of the columnar electrode 140 and the surface of the wetting layer 170.

For example, the solder, i.e., the material of the solder paste) can include tin, tin-lead mixture, or other tin alloys. The solder paste forming process can include, e.g., screen printing solder paste, spot welding to form solder ball (or tin ball), electroless plating to forming tin layer, electroplating to form tin layer, etc. The reflow process can include, e.g., ultrasonic reflow process, hot air reflow process, infrared reflow process, laser reflow process, gas phase reflow process, etc. The solder paste forming process and the reflow process can include any other suitable processes.

The wetting layer 170 can have high surface energy, and thus can have desirable wettability. During the reflow process, the solder not only can be located at the top of the columnar electrode 140, but also can flow to the sidewalls and bottom of the sidewalls of the columnar electrode 140. In addition, by controlling an amount of the solder paste, the solder ball 190 may also cover the surface of the wetting layer 170 on the electroplating seed layer 170. In various embodiments, contact surfaces between the solder ball 190 and the columnar electrode 140 (e.g., the copper pillar) can include at least the top surface and the sidewalls (e.g., curved sidewall) of the columnar electrode 140. As a result, when an external force flicks the solder ball 190, the solder ball 190 may not easily peel off from the surface of the columnar electrode 140.

According to the methods for forming a packaging structure as depicted above in various disclosed embodiments, various embodiments also provide a semiconductor packaging structure. Referring to FIG. 12, an exemplary structure can include a chip 100. A pad 101 can be formed on the chip 100. An insulating layer 110 can be disposed on the chip 100 and expose the pad 101. A first passivation layer 111 can be disposed on the insulating layer 110 and cover a portion of the pad 101. An electroplating seed layer 120 can be disposed on the pad 101 and on a portion of the first passivation layer 111. A columnar electrode 140 can be formed on the electroplating seed layer 120 such that a portion of the electroplating seed layer 120 surrounding the columnar electrode 140 can be exposed. A passivation layer 180 can be disposed on the first passivation layer 111 such that the passivation layer 180 can expose the columnar electrode 140. The structure can further include a diffusion barrier layer 160 disposed on sidewalls and a top surface of the columnar electrode 140 and surrounding a bottom of the columnar electrode 140. A wetting layer 170 can be disposed on the diffusion barrier layer 160. A solder ball 190 can be formed on the wetting layer 170. The solder ball 190 can wrap the top surface and the sidewalls of the columnar electrode 140 and the wetting layer 170 on the electroplating seed layer 120.

Figure 23:
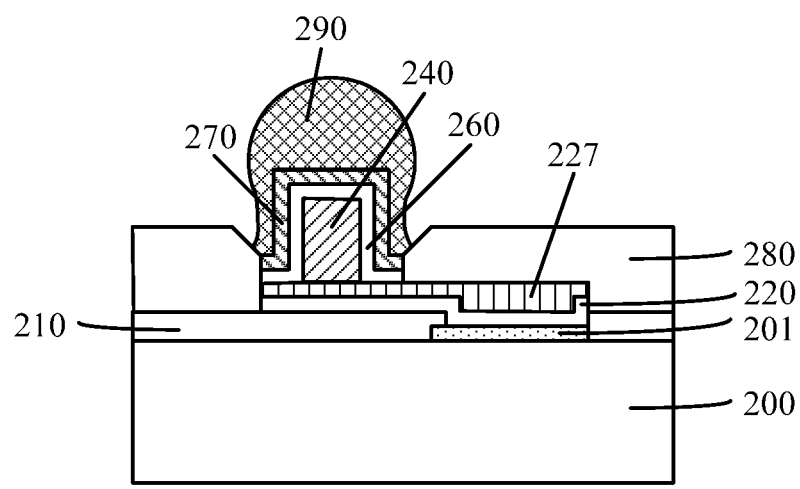
Figure 24:
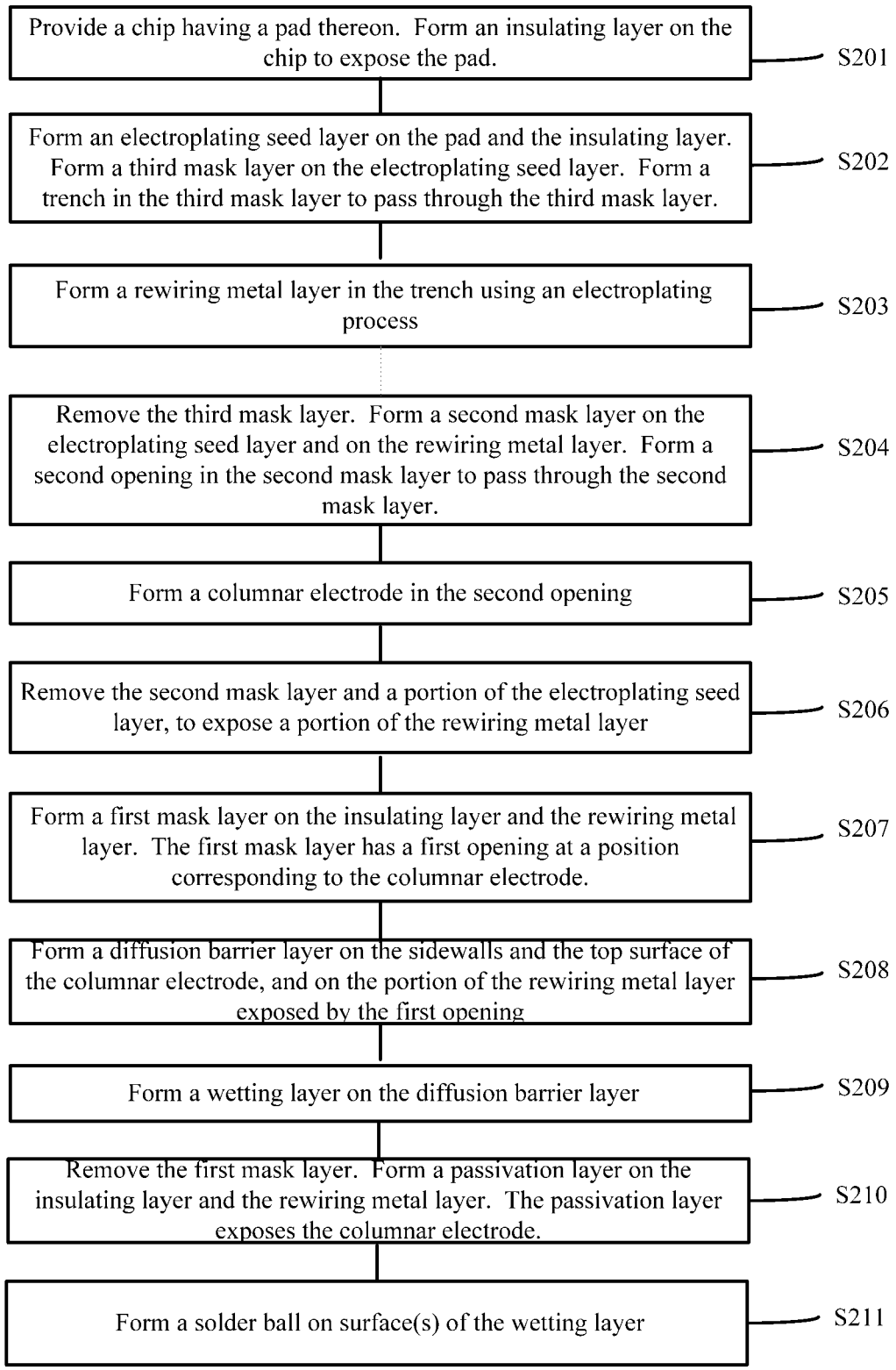
FIG. 24 depicts a flow diagram of another exemplary method for forming a semiconductor packaging structure in accordance with various disclosed embodiments.

FIG. 24 depicts a flow diagram of an exemplary method for forming a semiconductor packaging structure in accordance with various disclosed embodiments. FIGS. 13-23 depict cross-sectional views of the semiconductor packaging structure at various stages during its formation in accordance with various disclosed embodiments. Note that although FIGS. 13-23 depict structures corresponding to the method depicted in FIG. 24, the structures and the method are not limited to one another in any manner.

Figure 13:
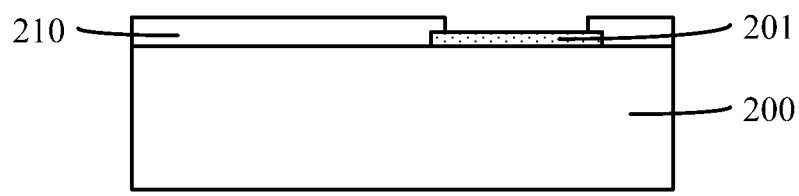
FIGS. 13-23 depict cross-sectional views of another exemplary semiconductor packaging structure at various stages during its formation in accordance with various disclosed embodiments.

In Step S201 of FIG. 24 and referring to FIG. 13, a chip 200 is provided. A pad 201 can be formed on a surface of the chip 200. An insulating layer 210 can be disposed on the surface of the chip 200 to expose the pad 201. The pad 201, a subsequently-formed electroplating seed layer on a surface of the pad 201 and a rewiring metal layer on a surface of the electroplating seed layer can form a metal interconnect structure.

Figure 14:
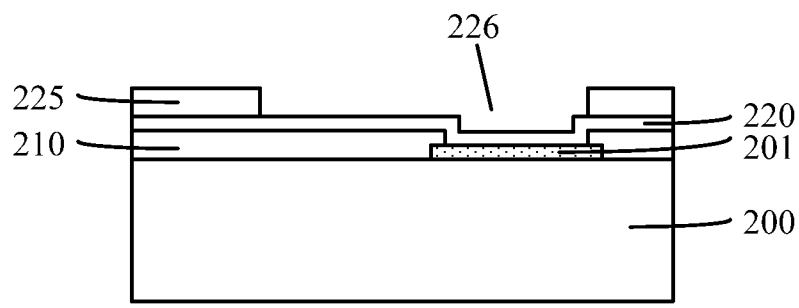

In Step S202 of FIG. 24 and referring to FIG. 14, an electroplating seed layer 220 is formed on the pad 201 and on a surface of the insulating layer 210. A third mask layer 225 can be formed on the surface of the electroplating seed layer 220. A trench 226 can be formed in the third mask layer 225 to pass through the third mask layer 225.

The third mask layer 225 can be made of a material including one or more of photoresist, silicon oxide, silicon nitride, amorphous carbon. In one embodiment, the third mask layer 225 can be made of a photoresist. The trench 226 passing through the third mask layer 225 can be formed in the third mask layer 225 using a photolithography process. The trench 226 can subsequently be used for forming a rewiring metal layer. One end (or one portion) of the trench 226 can be located above the pad 201, and the other end (or another portion) of the trench 226 can be located above the insulating layer 210.

Figure 15:
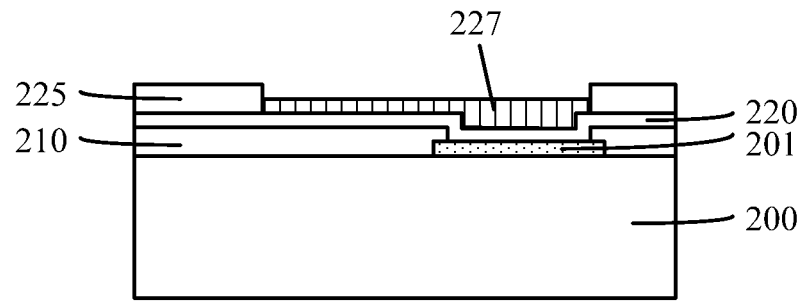

In Step S203 of FIG. 24 and referring to FIG. 15, a rewiring metal layer 227 is formed in the trench 226 (e.g., as shown in FIG. 14), e.g., using an electroplating process.

The rewiring metal layer 227 can include a single-layer structure or a multi-layer stacking structure. In one embodiment, the rewiring metal layer 227 can include a single-layer metal structure. For example, the rewiring metal layer 227 can be made of a material including copper. The electroplating process can be similar to or the same as depicted as in various disclosed embodiments (e.g., as in FIG. 2).

In other embodiments, an aluminum metal layer, a copper metal layer or an aluminum-copper metal layer, etc. can be formed on the surface of the electroplating seed layer 220 using a sputtering process or a physical vapor deposition process. Next, the aluminum metal layer, the copper metal layer or the aluminum-copper metal layer, etc. can be etched using a dry etching process. The rewiring metal layer 227 can then be formed.

One end (or one portion) of the rewiring metal layer 227 can be located on the electroplating seed layer 220 on the pad 201, and the other end (or another portion) of the rewiring metal layer 227 can be located on the electroplating seed layer 220 on the insulating layer 210. A subsequently-formed columnar electrode can be formed on the surface of the rewiring metal layer 227 above the insulating layer 210.

In various embodiments, in order to improve packaging quality, spacing and positions of subsequently-formed packaging solder joints (i.e., solder balls) need to be properly set. Thus, the packaging solder joints often have fixed positions. However, the pads of the semiconductor chips can often have a position arrangement different from an ideal arrangement of the packaging solder joints. Therefore, the pads and the packaging solder joints may need to be electrically connected using a rewiring metal layer.

Figure 16:
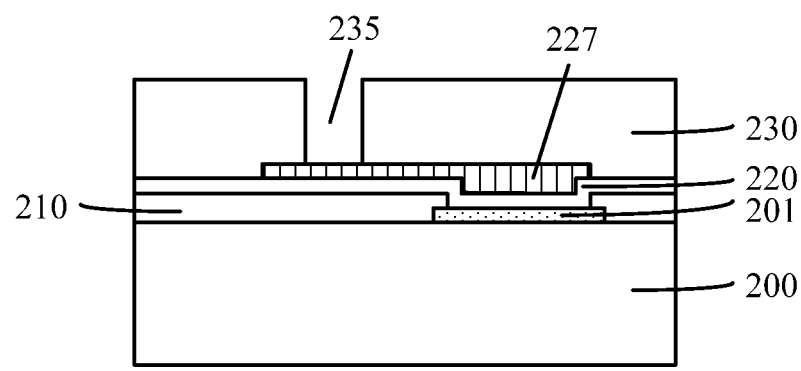

In Step S204 of FIG. 24 and referring to FIG. 16, the third mask layer 225 (e.g., as shown in FIG. 15) is removed. A second mask layer 230 can be formed on the electroplating seed layer 220 and on a surface of the rewiring metal layer 227. A second opening 235 can be formed in the second mask layer 230 to pass through the second mask layer 230. The second opening 235 can expose a portion of the rewiring metal layer 227. In addition, a top-view size of the second opening 235 can be smaller than a top-view size of the rewiring metal layer 227 at a corresponding position. As a result, there can be a portion of the rewiring metal layer 227 surrounding the exposed portion of the rewiring metal layer 227. A process of forming the second mask layer 230 and the second opening 235 can be the same as or similar to the processes depicted in various embodiments (e.g., in FIG. 2).

Figure 17:
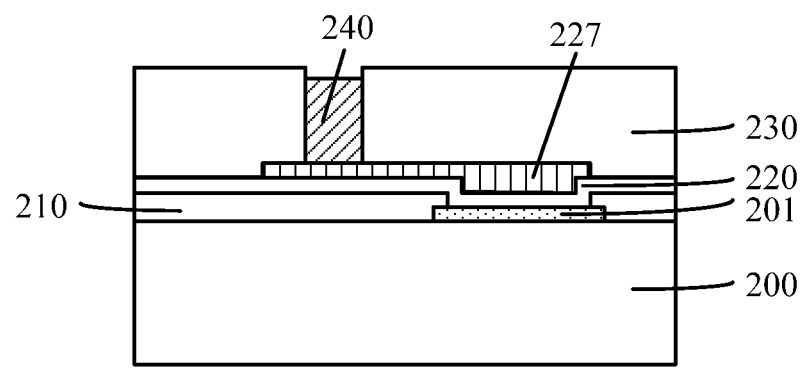

In Step S205 of FIG. 24 and referring to FIG. 17, a columnar electrode 240 is formed in the second opening 235 (e.g., as shown in FIG. 16) using an electroplating process. The electroplating process can be similar to or the same as depicted as in various disclosed embodiments (e.g., as in FIG. 2).

Figure 18:
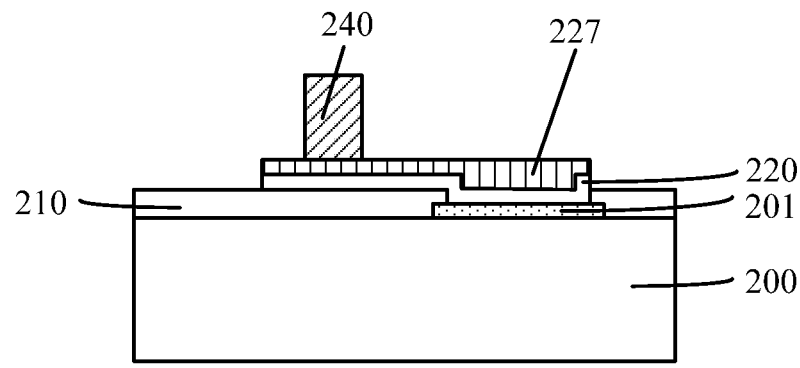

In Step S206 of FIG. 24 and referring to FIG. 18, the second mask layer 230 (e.g., as shown in FIG. 17) and a portion of the electroplating seed layer 220 are removed, to expose a portion of the rewiring metal layer 227. After the second mask layer 230 is removed, a portion of the electroplating seed layer 220 and a portion of the rewiring metal layer 227 can be exposed. For example, a process of removing the electroplating seed layer 220 can include the following steps. A fourth mask layer (not shown) can be formed on the surface of the electroplating seed layer 220 and the rewiring metal layer 227. The fourth mask layer can cover the columnar electrode 240 and the rewiring metal layer 227. Using the fourth mask layer as an etch mask, the exposed portion of the electroplating seed layer 220 can be removed using a wet etching process or a dry etching process, until the insulating layer 210 is exposed. The fourth mask layer can then be removed.

Figure 19:
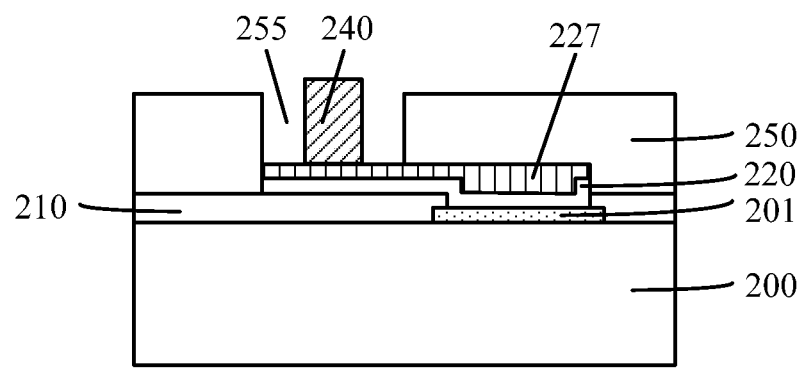

In Step S207 of FIG. 24 and referring to FIG. 19, a first mask layer 250 is formed on the insulating layer 210 and the rewiring metal layer 227. The first mask layer 250 can have a first opening 255 at a position corresponding to the columnar electrode 240. The first opening 255 can have a size (e.g., a top-view size) greater than a size (e.g., a top-view size) of the columnar electrode 240. In addition, there can be a gap between sidewalls of the first opening 255 and the sidewalls of the columnar electrode 140. The process of forming the first mask layer 250 can be similar to or the same as depicted as in various disclosed embodiments (e.g., as in FIG. 2).

Figure 20:
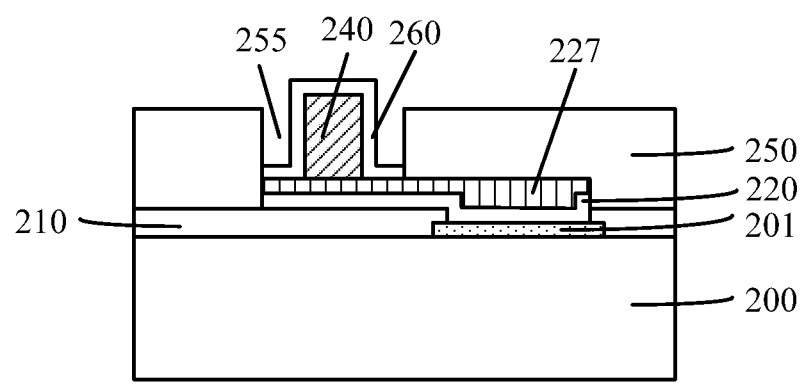

In Step S208 of FIG. 24 and referring to FIG. 20, a diffusion barrier layer 260 is formed on the sidewalls and the top surface of the columnar electrode 240, and on the portion of the rewiring metal layer 227 exposed by the first opening 255. The process of forming the diffusion barrier layer 260 can be similar to or the same as depicted as in various disclosed embodiments (e.g., as in FIG. 2).

Figure 21:
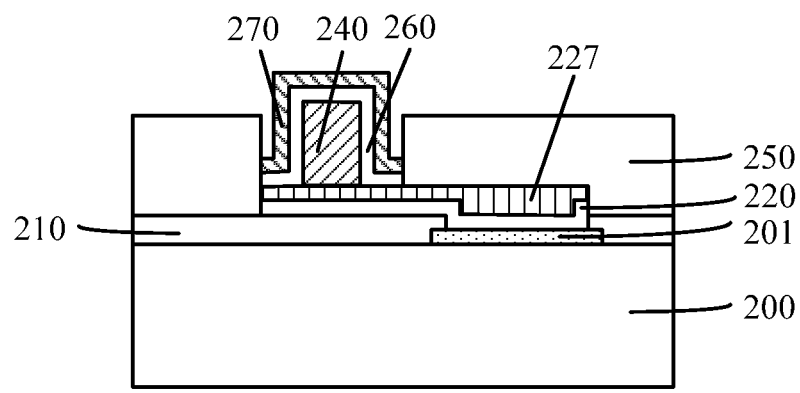

In Step S209 of FIG. 24 and referring to FIG. 21, a wetting layer 270 is formed on a surface of the diffusion barrier layer 260. The process of forming the wetting layer 270 can be similar to or the same as depicted as in various disclosed embodiments (e.g., as in FIG. 2).

Figure 22:
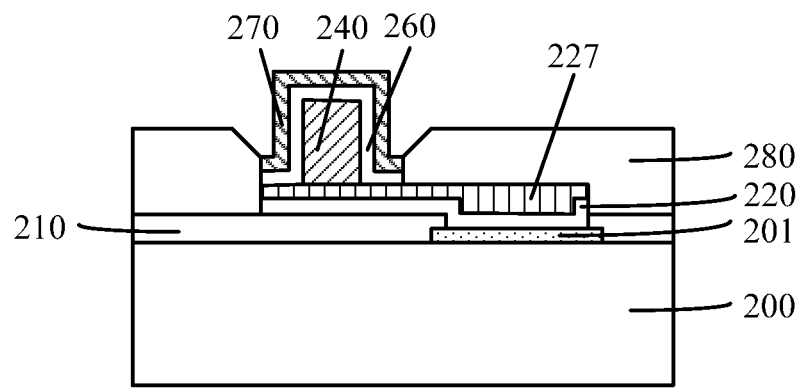

In Step S210 of FIG. 24 and referring to FIG. 22, the first mask layer 250 (e.g., referring to FIG. 21) is removed. A passivation layer 280 can be formed on the insulating layer 210 and the rewiring metal layer 227. The passivation layer 280 can expose the columnar electrode 240. The processes of removing the first mask layer 250 and forming the passivation layer 280 can be similar to or the same as depicted as in various disclosed embodiments (e.g., as in FIG. 2).

In Step S211 of FIG. 24 and referring to FIG. 23, a solder ball 290 is formed on surface(s) of the wetting layer 270. The solder ball 290 can wrap surface(s) of the wetting layer 270 on the top surface and the sidewalls of the columnar electrode 240 and on the rewiring metal layer 227. The process of forming the solder ball 290 can be similar to or the same as depicted as in various disclosed embodiments (e.g., as in FIG. 2).

According to the methods for forming a packaging structure as depicted above in various disclosed embodiments, various embodiments also provide a semiconductor packaging structure. Referring to FIG. 23, an exemplary structure can include a chip 200. A pad 201 can be formed on the chip 200. An insulating layer 210 can be disposed on the chip 200 and expose the pad 201. An electroplating seed layer 220 can be disposed on the insulating layer 210 and the pad 201. A rewiring metal layer 227 can be disposed on the surface of the electroplating seed layer 220 on the insulating layer 210 and the pad 201. The pad 201, the electroplating seed layer 220 on the insulating layer 210 and the pad 201, and the rewiring metal layer 227 on the electroplating seed layer 220, can form a metal interconnect structure. A columnar electrode 240 can be formed on the rewiring metal layer 227 such that a portion of the rewiring metal layer 227 surrounding the columnar electrode 240 can be exposed. A passivation layer 280 can be disposed on the insulating layer 210 and the rewiring metal layer 227, such that the passivation layer 280 can expose the columnar electrode 240. The structure can further include a diffusion barrier layer 260 disposed on sidewalls and a top surface of the columnar electrode 240 and on the exposed rewiring metal layer 227 surrounding the columnar electrode 240. A wetting layer 270 can be disposed on the diffusion barrier layer 260. A solder ball 290 can be formed on the wetting layer 270. The solder ball 290 can wrap the surfaces of the wetting layer 170 on the top surface and the sidewalls of the columnar electrode 240 and on the rewiring metal layer 227.

The embodiments disclosed herein are exemplary only. Other applications, advantages, alternations, modifications, or equivalents to the disclosed embodiments are obvious to those skilled in the art and are intended to be encompassed within the scope of the present disclosure.

What is claimed is:

1. A method for forming a semiconductor packaging structure, comprising:
   providing a chip having a metal pad thereon;
   forming an insulating layer on the chip to expose the metal pad;
   forming an electroplating seed layer on the insulating layer and contacting an exposed surface of the metal pad;
   forming a columnar electrode on the electroplating seed layer, wherein a first portion of the electroplating seed layer is formed to surround a bottom of the columnar electrode;
   forming a second mask layer with a second opening on the insulating layer, forming the columnar electrode in the second opening, and removing the second mask layer, a top-view size of the second opening being equal to a top-view size of the columnar electrode;
   forming a first mask layer on and contacting the insulating layer, the first mask layer having a first opening at a position corresponding to the columnar electrode, the first opening having a top-view size greater than the top-view size of the columnar electrode, and a gap existing between sidewalls of the first opening and sidewalls of the columnar electrode;
   forming a diffusion barrier layer on the sidewalls and a top surface of the columnar electrode, and on the first portion of the electroplating seed layer surrounding the bottom of the columnar electrode by using an electroless plating process or an electroplating process and the first mask layer as a mask;
   removing a second portion of the electroplating seed layer surrounding the first portion of the electroplating seed layer; and
   after the removing of the second portion of the electroplating seed layer, forming a solder paste layer on the diffusion barrier layer and forming a solder ball from the solder paste layer, wherein the solder ball has an approximately Ω-shape, includes a near-spherical solder head and a near-columnar solder body, an outer diameter of the near-spherical solder head is larger than an outer diameter of the near-columnar solder body, the near-spherical solder head wraps the top surface of the columnar electrode, and the near-columnar solder body wraps the sidewalls of the columnar electrode.

2. The method according to claim 1, wherein the diffusion barrier layer includes a nickel layer.

3. The method according to claim 1, further including:
   forming a wetting layer on the diffusion barrier layer, wherein the solder ball is formed on the wetting layer.

4. The method according to claim 3, wherein the wetting layer is made of a material including gold, silver, indium, tin, or a combination thereof.

5. The method according to claim 4, further including:
   forming a first passivation layer on the insulating layer, wherein the first passivation layer exposes the columnar electrode.

6. The method according to claim 1, wherein the semiconductor packaging structure further includes:
   a rewiring metal layer on the electroplating seed layer, wherein the columnar electrode is formed on the rewiring metal layer.

7. The method according to claim 6, further including:
   forming a second passivation layer on the insulating layer and the rewiring metal layer, wherein the second passivation layer exposes the columnar electrode.

8. A semiconductor packaging structure, comprising:
   a chip having a metal pad thereon;
   an insulating layer on the chip to expose the metal pad;
   an electroplating seed layer on the insulating layer and contacting an exposed surface of the metal pad;
   a columnar electrode on the electroplating seed layer, wherein a first portion of the electroplating seed layer is formed to surround a bottom of the columnar electrode;
   a diffusion barrier layer on sidewalls and a top surface of the columnar electrode, and on the first portion of the electroplating seed layer surrounding the bottom of the columnar electrode, wherein a second portion of the electroplating seed layer surrounding the first portion of the electroplating seed layer is removed; and
   a solder ball on the diffusion barrier layer, wherein the solder ball has an approximately Ω-shape, includes a near-spherical solder head and a near-columnar solder body, an outer diameter of the near-spherical solder head is larger than an outer diameter of the near-columnar solder body, the near-spherical solder head wraps the top surface of the columnar electrode, and the near-columnar solder body wraps the sidewalls of the columnar electrode.

9. The semiconductor packaging structure according to claim 8, wherein the diffusion barrier layer includes a nickel layer.

10. The semiconductor packaging structure according to claim 8, further including a wetting layer on the diffusion barrier layer, wherein the solder ball is formed on the wetting layer.

11. The semiconductor packaging structure according to claim 10, wherein the wetting layer is made of a material including gold, silver, indium, tin, or a combination thereof.

12. The semiconductor packaging structure according to claim 11, further including:
    a first passivation layer on the insulating layer, wherein the first passivation layer exposes the columnar electrode.

13. The semiconductor packaging structure according to claim 8, further including:
    a rewiring metal layer on the electroplating seed layer, wherein the columnar electrode is formed on the rewiring metal layer.

14. The semiconductor packaging structure according to claim 13, further including:
    a second passivation layer on the insulating layer and the rewiring metal layer, wherein the second passivation layer exposes the columnar electrode.

15. The method according to claim 5, wherein, sidewall of the first passivation layer contacts sidewalls of the electroplating seed layer, the diffusion barrier layer, the wetting layer, and the near-columnar solder body.

16. The method according to claim 7, wherein sidewall of the second passivation layer contacts sidewalls of the electroplating seed layer, the rewiring metal layer, the diffusion barrier layer, the wetting layer, and the near-columnar solder body.

17. The semiconductor packaging structure according to claim 12, wherein, sidewall of the first passivation layer contacts sidewalls of the electroplating seed layer, the diffusion barrier layer, the wetting layer, and the near-columnar solder body.

18. The semiconductor packaging structure according to claim 14, wherein sidewall of the second passivation layer contacts sidewalls of the electroplating seed layer, the rewiring metal layer, the diffusion barrier layer, the wetting layer, and the near-columnar solder body.

19. A method for forming a semiconductor packaging structure, comprising:
provided a chip having a pad thereon;
forming an insulating layer on the chip to expose the pad;
forming an electroplating seed layer on the insulating layer and contacting an exposed surface of the pad;
forming a columnar electrode on the electroplating seed layer, wherein a first portion of the electroplating seed layer is formed to surround a bottom of the columnar electrode;
forming the diffusion barrier layer on sidewalls and a top surface of the columnar electrode by using an electroless plating process or an electroplating process;
removing a second portion of the electroplating seed layer surrounding the first portion of the electroplating seed layer; and
after the removing of the second portion of the electroplating seed layer, forming a solder paste layer on the diffusion barrier layer and forming a solder ball from the solder paste layer, wherein the solder ball has an approximately Ω-shape, includes a near-spherical solder head and a near-columnar solder body, an outer diameter of the near-spherical solder head is larger than an outer diameter of the near-columnar solder body, the near-spherical solder head wraps the top surface of the columnar electrode, and the near-columnar solder body wraps the sidewalls of the columnar electrode.

* * * * *